United States Patent [19]
Melatti et al.

[11] Patent Number: 5,338,223
[45] Date of Patent: Aug. 16, 1994

[54] HYBRID WAFER PROBE

[75] Inventors: Livio R. Melatti, Nazareth, Pa.; Victor J. Velasco, Princeton, N.J.

[73] Assignee: AT&T Bell Laboratories, Murray Hill, N.J.

[21] Appl. No.: 959,517

[22] Filed: Oct. 13, 1992

Related U.S. Application Data

[63] Continuation of Ser. No. 753,484, Sep. 3, 1991, abandoned.

[51] Int. Cl.[5] .............................................. H01R 11/18
[52] U.S. Cl. ...................................... 439/482; 324/757
[58] Field of Search ............... 324/158 F, 158 P, 72.5; 439/169, 219, 482, 607, 55, 912

[56] References Cited

U.S. PATENT DOCUMENTS

| | | | |
|---|---|---|---|
| 4,116,523 | 9/1978 | Coberly et al. | 439/607 X |
| 4,476,433 | 10/1984 | Logan | 439/482 X |
| 4,649,339 | 3/1987 | Grangroth et al. | 324/158 F |
| 4,727,319 | 2/1988 | Shahriary | 324/158 P |
| 4,791,363 | 12/1988 | Logan | 324/158 P |
| 4,827,211 | 5/1989 | Strid et al. | 324/158 P |
| 4,837,622 | 6/1989 | Whann et al. | 324/158 P |
| 4,972,143 | 11/1990 | Kamensky et al. | 324/72.5 X |
| 5,055,778 | 10/1991 | Okubo et al. | 324/158 P |
| 5,059,898 | 10/1991 | Barsotti et al. | 324/72.5 X |

OTHER PUBLICATIONS

IBM Technical Bulletin, vol. 15, No. 4, Sep. 1972.

*Primary Examiner*—Khiem Nguyen
*Attorney, Agent, or Firm*—Robert B. Levy

[57] ABSTRACT

A hybrid wafer probe (10) for probing metallized areas (12) on a substrate (14), such as a semiconductor wafer, includes an insulative member (16) having a ground plane (21) on at least one of its major surfaces. Embedded within the insulative member (16) is a plurality of wires (24) each having a first end (26) protruding beyond the member for connection to a testing machine. Each wire has a second end (28) provided with a sharp tip (30) that protrudes through the member (16) in a region spaced from the ground plane (21) so as to depend below the member for making contact with the metallized areas on the substrate to be probed. By displacing the member (16) relative to the substrate (14) while the tips (30) of the wires 24 are in contact with the metallized area, the tips can scratch the surface of the metallized areas to make a reliable electrical connection therewith.

6 Claims, 1 Drawing Sheet

HYBRID WAFER PROBE

This application is a continuation of application Ser. No. 753,484, filed on Sep. 3, 1991, now abandoned.

TECHNICAL FIELD

This invention relates to a probe for making a reliable electrical contact with metallized areas on a substrate, such as a semiconductor wafer.

BACKGROUND OF THE INVENTION

Today's semiconductor devices are fabricated from a wafer of semiconductor material, such as silicon or the like, which is typically subjected to an epitaxial growth process and a diffusion process to establish at least one circuit on the wafer. Following such processing, the wafer is diced into individual chips which each contain a separate one of the circuits formed on the wafer. Prior to dicing the wafer, the wafer is commonly "probed" (i.e., electrically contacted) with a wafer probe especially designed for this task. The purpose in probing the wafer is to inject test signals into, and recover response signals from, each circuit on the wafer to verify its operation. Circuits which are found to be defective are marked so that after the wafer is diced, the defective circuits can be separated and discarded.

There are presently two main types of wafer probes in use for probing semiconductor wafers during their manufacture. The first type of probe consists of a plurality of rigid wires, typically made from tungsten or the like, each wire having one of its ends rigidly attached to a support member so as to be cantilevered therefrom. At the opposite end of each wire is a hardened tip which is adapted to make an electrical contact with a metallized area on the wafer to be probed. By moving the support member, the tips of the wires can be brought into contact with successive sets of metallized areas on the wafer to make contact with such areas for testing purposes.

The advantage of this type of probe is that the hardness of the tips of the wires allows them to "scrub" (i.e., scratch) the metallized areas on the wafer when the wires are moved with respect to the wafer or vice versa. The metallized areas, particularly when fabricated from aluminum, are often covered with an oxide layer which reduces their conductivity and thus impairs testing of the wafer. By displacing the wafer during probing relative to the probe (or vice versa), the tips of the wires will scrub the metallized areas and thereby break through whatever oxide layer is present to assure a reliable electrical connection with the wafer.

While this type of probe offers the ability to scrub the metallized areas on the wafer to assure a reliable electrical contact therewith, the probe is not without its disadvantages. One major disadvantage is that the individual signal-carrying wires are not shielded in any way thus, impairing the ability of the probe to test the wafer at high frequencies because of the increased likelihood of coupling and cross talk.

The other type of probe commonly in use generally consists of a plurality of strip line sections, each secured at one of its ends to a support. Each strip line section has a ground plane on its lower major surface which shields a signal line on the strip line section that terminates at a depending conductive bump (usually fabricated from a hard metal alloy) at the end of the strip line section opposite the one attached to the support member. The depending bump at the end of each strip line section serves as the means for making contact with a corresponding metallized area on the semiconductor wafer to be probed.

The advantage of the strip line-type fixture is that each of its ground planes shields each signal-carrying line passing between the wafer and the probe, thereby reducing the incidence of cross talk and coupling as compared to the wire-type probe described earlier. However, as compared to the wire-type probe, the strip line-type probe generally cannot scrub the metallized areas on the wafer because the conductive bump on each strip line section is not sufficiently rigid so that when the wafer is displaced relative to the probe, the bump could be detached from the line.

Thus, there is a need for a wafer probe which can scrub the metallized areas on a substrate, such as a semiconductor wafer, to make a good electrical contact therewith, while offering reduced incidence of cross talk and coupling between signals transmitted to and recovered from the substrate.

SUMMARY OF THE INVENTION

Briefly, in accordance with a preferred embodiment of the invention, a hybrid probe is disclosed for probing (i.e., making electrical contact with) at least a pair of metallized areas on a major surface of a substrate such as a semiconductor wafer. The probe of the invention comprises at least one member fabricated of an insulative material (e.g., polyimide) and positioned so that at least a portion of the member overlies a portion of the substrate which has a metallized area to be probed. Embedded within the insulative member is a plurality of electrically conductive wires (e.g., tungsten or other hard metals or metal alloys), each having a first end extending through, so as to depend below the portion of the member overlying the substrate. Each first end of each wire has a rigid tip adapted to pierce a possible insulating layer on a metallized area on the substrate when the substrate is displaced relative to the insulative member while the wire tips are in contact with the metallized areas. A ground plane is provided on at least one of the major surfaces of the insulative member so as to be spaced from the tips of the wires for shielding signals carried by the wires embedded within the member.

The probe of the invention offers the advantage of being able to scrub the metallized areas on a substrate to be probed, to facilitate making a good electrical connection therewith, while shielding signals passed between the substrate and the probe to reduce the incidence of cross-talk.

DETAILED DESCRIPTION

Figure 1:
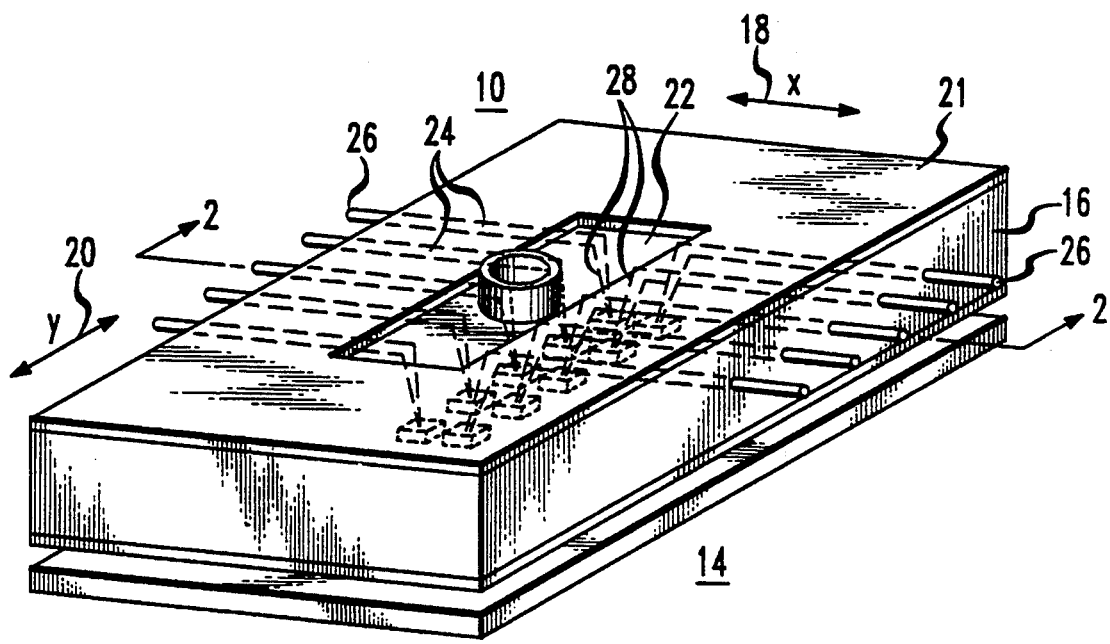
FIG. 1 is a perspective view of a wafer probe in accordance with the teachings of the invention.
Figure 2:
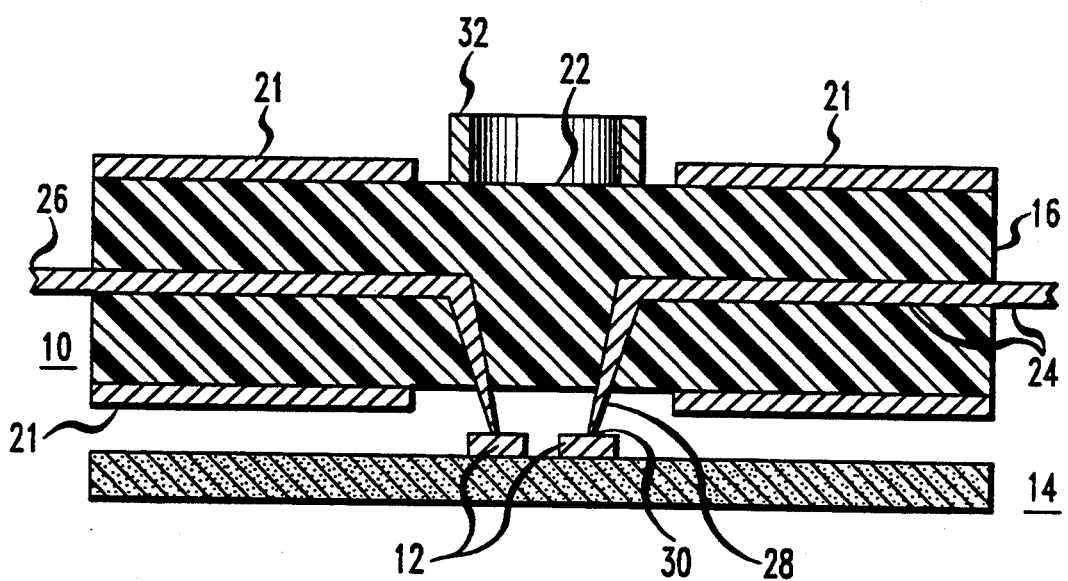
FIG. 2 is a cross-sectional side of the wafer probe of FIG. 1 taken along the plane 2—2.

Referring to FIGS. 1 and 2, there are shown perspective, and cross-sectional side views, respectively, of a probe 10, in accordance with the invention, for probing (i.e., electrically contacting) a plurality of metallized areas 12 (See FIG. 2) on a substrate 14, such as a semiconductor wafer, underlying the probe. The probe 10 is comprised of an insulative member 16, typically formed of a non-conductive resin such as polyimide or the like, and carried by a support (not shown). Means (not shown), typically in the form of one or more micropositioning devices (e.g., stepping motors), are provided for precisely displacing the wafer 14 along a separate one of x and y axes 18 and 20, respectively relative to the probe 10.

On at least one, and preferably both of the major surfaces of the member 16 is a ground plane 21, typically formed of metallic layer of copper or the like. Centrally located within the member 16 is a translucent window 22 which allows the wafer 14 to be visible through the member.

Embedded within the insulative member 16 is a plurality of rigid, electrically conductive wires 24, each fabricated from a hard metal such as tungsten or the like or from a hard metal alloy. In the preferred embodiment, each wire 24 is embedded within the member 16 such that a first end 26 of the wire extends beyond the member (typically through one of its sides) so as to be insulated from the ground plane 21, for connection to a testing machine (not shown) of the type well known in the art for injecting test signals into, and recovering response signals from the wafer 14.

Each wire 22 has a second, opposite end 28 which extends into the window 22 so the wire end has its tip 30 protruding through and depending below the member 16 towards the metallized areas 12 on the wafer 14. In this way, the second end 28 of each wire 24 is insulated from the ground plane. The wires 24 are embedded such that the tips 30 are arranged in a pattern corresponding to the pattern of metallized areas 12 to be probed on the wafer 14.

The tip 30 at the end 28 of each wire 24 is made very sharp for the purpose of piercing a possible oxide layer (not shown) on the metallized area 12 when the probe is positioned so that the tip is contiguous with the area. To pierce. the oxide coating on each metallized area 12, the wafer 14, after having been positioned so that the tips 30 are in contact with the metallized areas, is then displaced laterally a very short distance. By so displacing the wafer 14 relative to the insulative member 16, each tip 30 will "scrub" (i.e., scratch) the metallized area 12 in contact therewith to pierce the oxide coating on the metallized area to allow the wire to make a reliable contact with the area.

Successful scrubbing of the metallized areas 12 requires that the wires 24 remain stiff. Otherwise, wire bending or even breakage could result. With the probe 10, stiffness of the wires 24 is assured because each wire is substantially embedded within the member 16 which maintains the rigidity and position of the wire. Thus, the probe 10 avoids the problem of bending or breakage of the wires 24. Referring to FIG. 2, to assure planarity of the tips 30, it may be useful to contact the portion of the member 16 situated within the window 22 with a ring 32 so as to press the wires 24 towards the wafer 14.

An additional advantage of the probe 10 is that the signals which are injected to and recovered from the wafer 14 via the wires 24 are shielded by the ground plane 21 on each major surface of the member 16. The shielding of the signals carried by the wires 24 advantageously helps to reduce the incidence of cross talk and coupling which can adversely affect the quality of the probing of the wafer 14. Furthermore, by altering either the thickness of the wires 24 or the thickness of the member 16, or both, the characteristic impedance of the signal paths provided by the wires in the member can be changed.

The foregoing describes a wafer probe 10 for probing metallized areas 12 on a wafer 14 so as to afford the ability to make a scrubbing contact with the metallized areas, as well as to shield electrical signals passed between the probe and the wafer.

It is to be understood that the above-described embodiments are merely illustrative of the principles of the invention. Various modifications and changes may be made thereto by those skilled in the art which will embody the principles of the invention and fall within the spirit and scope thereof. In particular, while the probe 10 has been described as being operative to probe a semiconductor wafer 14, the probe may also be employed to probe other types of substrates as well.

We claim:

1. A hybrid wafer probe for scratching a surface of a separate one of a plurality of metallized areas on a substrate so as to make an electrical connection therewith, comprising:

a rigid one-piece insulative member having major surfaces for overlying a portion of a substrate to be probed;

a ground plane on at least one of the major surfaces of the member; and a plurality of metallic wires, each having a body portion completely embedded within the insulative member so that the body portion of each wire is shielded by the ground plane, each wire having a first end which extends from the body portion and is insulated from ground plane so as to protrude beyond the member for connection to a testing machine, and each wire having a second end protruding from the body portion opposite the first end, the second end provided with a sharp tip which protrudes through the member in a region spaced from the ground plane so as to depend below the member for scratching the surface of, to make an electrical connection with, a metallized area on the substrate being probed.

2. The probe according to claim 1 wherein the insulative member has a centrally located translucent window portion which extends therethrough and wherein each wire has its second end extending into the window in the member and depending therebeneath.

3. The probe according to claim 1 wherein the insulative member is fabricated from the polyimide.

4. The probe according to claim 1 wherein each wire is fabricated from tungsten.

5. The probe according to claim 1 wherein each major surface of the member has a ground plane thereon.

6. A method of probing metallized areas on a substrate comprising the steps of:

providing a probe comprising: a rigid one-piece insulative member having major surfaces, a ground plane carried by at least one of the major surfaces of the member, and a plurality of metallic wires, each having a body portion completely embedded within the insulative member so that the body portion of each wire is shielded by the ground plane, each wire having a first end which extends from the body portion and is insulated from ground plane so as to protrude beyond the member for connection to a testing machine, and each wire having a second end protruding from the body portion opposite the first end, the secnd end provided with a sharp tip which protrudes through the member so as to depend therebeneath;

positioning the probe above a portion of the substrate to be probed such that each wire has the tip at its second end in contact with a corresponding metallized area on the substrate to be probed; and displacing the member relative to the substrate to be probed while each wire has the tip at its second end in contact with the corresponding metallized area so that the tip scratches the metallized area to make a reliable electrical contact therewith.

* * * * *